(12) United States Patent
Morishige

(10) Patent No.: US 6,926,801 B2
(45) Date of Patent: Aug. 9, 2005

(54) LASER MACHINING METHOD AND APPARATUS

(75) Inventor: Yukio Morishige, Tokyo (JP)

(73) Assignee: Laserfront Technologies, Inc. (JP)

( * ) Notice: Subject to any disclaimer, the term of this patent is extended or adjusted under 35 U.S.C. 154(b) by 194 days.

(21) Appl. No.: 10/437,192

(22) Filed: May 14, 2003

(65) Prior Publication Data

US 2003/0217809 A1 Nov. 27, 2003

(30) Foreign Application Priority Data

May 22, 2002 (JP) ........................................ 2002-148353

(51) Int. Cl.⁷ ........................ C23F 1/00; H01L 21/306; C23C 16/00; C23C 16/10; C23C 16/48
(52) U.S. Cl. .............................. 156/345.5; 156/345.29; 156/345.33; 118/715; 118/722
(58) Field of Search ................................ 118/715, 722, 118/50.1; 156/345.33, 345.29, 345.5

(56) References Cited

U.S. PATENT DOCUMENTS

| | | | | |
|---|---|---|---|---|
| 4,801,352 A | * | 1/1989 | Piwczyk .................. | 156/345.5 |
| 5,266,532 A | | 11/1993 | Russell et al. | |
| 5,405,481 A | * | 4/1995 | Licoppe et al. ........ | 156/345.24 |
| 5,525,156 A | * | 6/1996 | Manada et al. ............. | 118/715 |
| 5,540,772 A | * | 7/1996 | McMillan et al. ............ | 118/50 |
| 5,962,085 A | * | 10/1999 | Hayashi et al. ............. | 427/585 |
| 5,997,963 A | * | 12/1999 | Davison et al. ............. | 427/582 |
| 6,136,096 A | * | 10/2000 | Morishige .................... | 118/720 |
| 6,333,130 B1 | * | 12/2001 | Morishige ....................... | 430/5 |
| 6,678,304 B2 | * | 1/2004 | Morishige ..................... | 372/55 |
| 2003/0217809 A1 | * | 11/2003 | Morishige ................ | 156/345.5 |
| 2004/0011289 A1 | * | 1/2004 | Morishige et al. .......... | 118/722 |
| 2005/0000438 A1 | * | 1/2005 | Lim et al. .................... | 118/722 |

FOREIGN PATENT DOCUMENTS

| | | |
|---|---|---|
| JP | 1-502149 | 7/1989 |
| JP | 2002-062637 | 2/2002 |

OTHER PUBLICATIONS

Chinese Office Action issued Nov. 26, 2004.

* cited by examiner

Primary Examiner—Jeffrie R. Lund
(74) Attorney, Agent, or Firm—Dickstein, Shapiro, Morin & Oshinsky, LLP.

(57) ABSTRACT

In a laser machining method for removing remaining defects on a photomask, there has been problems to be resolved that damage is formed at the portion of the substrate where the defect has been removed, thus resulting in degraded quality of machining. In a laser machining method for removing remaining defects on a photomask by a method of laser machining, the remaining defects are removed by using a configuration in which irradiation with a laser beam is performed from below with a to-be-machined surface directed downward, and irradiation with a laser beam in an atmosphere containing a halogenated hydrocarbon gas (as an example, ethyl iodide).

12 Claims, 3 Drawing Sheets

LASER MACHINING METHOD AND APPARATUS

BACKGROUND OF THE INVENTION

1. Field of the Invention

The invention relates to a method of laser machining for correcting pattern defects on photomasks and liquid crystal substrates, and a laser machining apparatus using the method.

2. Description of the Related Art

One of prior art laser machining apparatuses for correcting pattern defects on photomasks and liquid crystal substrates is disclosed in Japanese Patent Laid-Open No. 2002-62637. In the method for correcting pattern defects disclosed by this application, a substrate is irradiated with a laser beam while its surface to be machined is directed downward thereby removing defects on the substrate by laser vaporization. In this method disclosed, the substrate surface can be observed without lowering the resolution of an optical system for observing it while the substrate surface is being irradiated with a laser beam. Further, since fine particles produced by the laser vaporization can fall down by gravitation, a highly accurate pattern can be formed, and the amount of fine particles resettling on the substrate can be limited to a minimum.

Also, a laser machining apparatus according to the National Publication of International Patent Application No. 1989-502149 (PCT/US87/03488) has a gas enclosure having a blowoff port and inlet port of gas which are shaped concentrically like a donut. This feature allows the local blowing of gas onto the substrate, switching of gases, and switching of the directions of blowoff and suction of gas. Then, one apparatus can perform both the forming of a pattern film by laser CVD and the removing of a pattern film by laser vaporization.

However, laser correction methods using the conventional laser vaporization method require that laser irradiation instantaneously heat a pattern film to be removed to a high temperature of several thousand degrees Celsius, and this causes a problem that the irradiation can dig holes in the substrate surface with a pattern film adhering thereon even if the substrate is a high-temperature-resistant substrate such as quartz. For example, in the case of a Cr mask for semiconductor processes, even if machining conditions such as laser power and pulse duration are optimized, damages with a depth of approximate 10 nm can be made in the substrate surface by the laser irradiation. For this reason, when this mask is used in the actual exposure process, the damages cause changes in the phase of the light for exposure, which can result in a developed pattern width different from the predetermined width. In order to decrease the depth of damages, laser power for correcting patterns may be lowered relative to the optimum condition but this causes a problem that the edge shape of laser beam-machined portions to be degraded in linearity.

In order to resolve these problems, there has been desired a method for etch removing a pattern by irradiation with a laser beam in an atmosphere of an etching gas. However, in the case of photomasks using chromium as a pattern material, which is generally chemically and thermally high resistant, there has been no proposal of etching gas which meets requirements for use in pattern correction operations, such as easy handling, proper reaction speed, and ability to make reaction products having a high vapor pressure.

Further, as disclosed in National Publication of International Patent Application No. 1989-502149 (PCT/US87/03488), in order to effectively provide a local atmosphere of a source gas, it is required that a gas enclosure for locally blowing gas on a substrate window have inlet port and blowoff port provided concentrically and centrally symmetrically around a laser irradiation portion. However, it is very difficult to construct such dual gas flow paths concentrically arranged around the laser irradiation portion in the gas enclosure, within the range of a usual gap distance of only about 1 mm, between the substrate surface and the gas enclosure, the distance depending on the operating range of the objective lens. Thus, this causes problems of high fabricating cost and low construction yield of the gas enclosure. In a high precision laser machining apparatus, the high resolution of the apparatus requires a shorter operating range, so that it is no longer possible to ensure a space for the gas enclosure. This causes a problem that a high precision machining apparatus cannot have such a gas window.

Further, in such a case where concentric blowoff and suction ports of gas are provided in the gas enclosure, in order to increase the concentration of a source gas at the machined portion and to reduce the adherence of fine particles produced at the machined portion to the substrate, the source gas may blow off from a small-diameter nozzle so that the source gas at the laser irradiation portion can be given high flow velocity. In this case, the gas shield effect of the blowoff port is broken, resulting in problems such as the leakage of the source gas into the surroundings, the mixing of air, and the like.

SUMMARY OF THE INVENTION

The invention has been achieved in view of these problems. An object of the invention is to provide a laser machining method and laser machining apparatus able to correct either one or both of clear defects and opaque defects, comprising a new etching gas able to machine and remove defects with laser power low enough to cause no deformation in the substrate, and a gas window having a gas shield function for forming locally and effectively an atmosphere of an etching source gas on the surface to be machined.

In order to resolve the above problems, the invention provides a laser machining method for removing a desired portion on a substrate by irradiating the substrate with a laser beam in an atmosphere of a source gas, characterized in that the source gas is a gas containing a halogenated hydrocarbon, and that the surface to be machined is directed downward.

Also, the laser machining method is characterized in that the halogenated hydrocarbon is a compound formed by the combination of any one halogen group of iodine, chlorine and bromine and any one hydrocarbon group of methyl group, ethyl group, and propane group. Also, the substrate is a chromium mask substrate.

Another invention according to the invention provides a laser machining apparatus which is a chamber-less laser machining apparatus, comprising a laser irradiation and observation system for performing irradiation with laser beam and optical observation on a portion to be machined on the substrate held on a X-Y positioning stage, a gas enclosure for forming a local atmosphere of an etching source gas or a local atmosphere of a CVD source gas around the portion to be machined with a small gap formed between a surface to be machined and the gas enclosure without contact with the surface to be machined on the substrate, and a source gas feeding and exhausting unit for feeding the source gas into the gas enclosure and exhausting it from the gas enclosure, wherein the substrate has the surface to be machined directed downward, the laser irradiation and observation optical system is arranged to perform the optical observation and the irradiation with the laser beam on a desired portion on the substrate from below, and the gas enclosure comprises a nozzle for blowing the source gas to a laser beam irradiation position of the portion to be machined on the substrate, a inlet port shaped like a crescent moon having the center of its opening positioned symmetrically with the nozzle with respect to the laser irradiation portion which is positioned in between the nozzle and the above described center in a horizontal plane, and a purge gas blowoff port shaped like a donut having opening widths varied such that the amount of purge gas blowing off from the opening portion near the inlet port may be more than the amount of purge gas blowing off from the opening portion near from the nozzle.

Further another invention according to the invention provides a laser machining apparatus which is a chamberless laser machining apparatus, comprising a laser irradiation and observation system for performing irradiation with a laser beam and optical observation on a portion to be machined on the substrate held on a X-Y positioning stage, a gas enclosure for forming a local atmosphere of an etching source gas or a local atmosphere of a CVD source gas around the portion to be machined with a small gap formed between a surface to be machined and the gas enclosure without contact with the surface to be machined on the substrate, and a source gas feeding and exhausting unit for feeding the source gas into the gas enclosure and exhausting it from the gas enclosure, wherein the substrate has the surface to be machined directed upward, the laser irradiation and observation optical system is arranged to perform the optical observation and the irradiation with the laser beam on a desired portion on the substrate from above, and the gas enclosure comprises a nozzle for blowing the source gas to a laser beam irradiation position of the portion to be machined on the substrate, a inlet port shaped like a crescent moon having the center of its opening positioned symmetrically with the nozzle with respect to the laser irradiation portion which is positioned in between the nozzle and the above described center in a horizontal plane, and a purge gas blowoff port shaped like a donut having opening widths varied such that the amount of purge gas blowing off from the opening portion near the inlet port may be more than the amount of purge gas blowing off from the opening portion near the nozzle.

Also, for the above two laser machining apparatuses, the amount of purge gas blowing off from the portion of the purge gas blowoff port near the inlet port is 1.5 times to 3.5 times more than the amount of the purge gas blowing off from the portion of the purge gas blowoff port near the nozzle. The etching gas is a source gas containing a halogenated hydrocarbon formed by the combination of any one halogen group of iodine, chlorine and bromine and any one hydrocarbon group of methyl group, ethyl group and propane group, and the substrate is a chromium mask substrate. Also, the source gas feeding and exhausting unit is characterized by comprising a mechanism for switching between the etching source gas and the CVD source gas according to a type of defect to be corrected.

The invention provides a laser machining method using a halogenated hydrocarbon represented by ethyl iodide as an etching gas, and a configuration in which the surface to be etched of a substrate is directed downward. Thereby, this method has a high level of safety in the respects of corrosivity, toxicity and flammability and therefore does not require complicated and expensive components to be used, thus reducing cost for introducing the apparatus and maintenance cost. Further, for the quality of machining, this method can provide high-quality correction in which damages in the substrate are limited to an extremely small degree and no bumps are formed on the edges of machined portions.

Also, applying the structure of the gas enclosure according to the invention to apparatuses of laser etching machining and laser CVD machining, it is possible to reduce the manufacturing cost of the apparatuses, and by increasing the upper limit of the velocity of flow of source gas allowed at the laser beam irradiation portion, machining conditions can be optimized over wide range and also the gap distance between the gas enclosure and the substrate can be made much larger than conventional methods, greatly reducing the probability of accidents scratching the surface to be machined. Thereby, the invention can provide a highly practical laser machining apparatus.

BRIEF DESCRIPTION OF THE DRAWINGS

The above and other objects, features and advantages of the present invention will become apparent from the following detailed description when taken with the accompanying drawings in which.

DETAILED DESCRIPTION OF THE PREFERRED EMBODIMENTS

Figure 1:
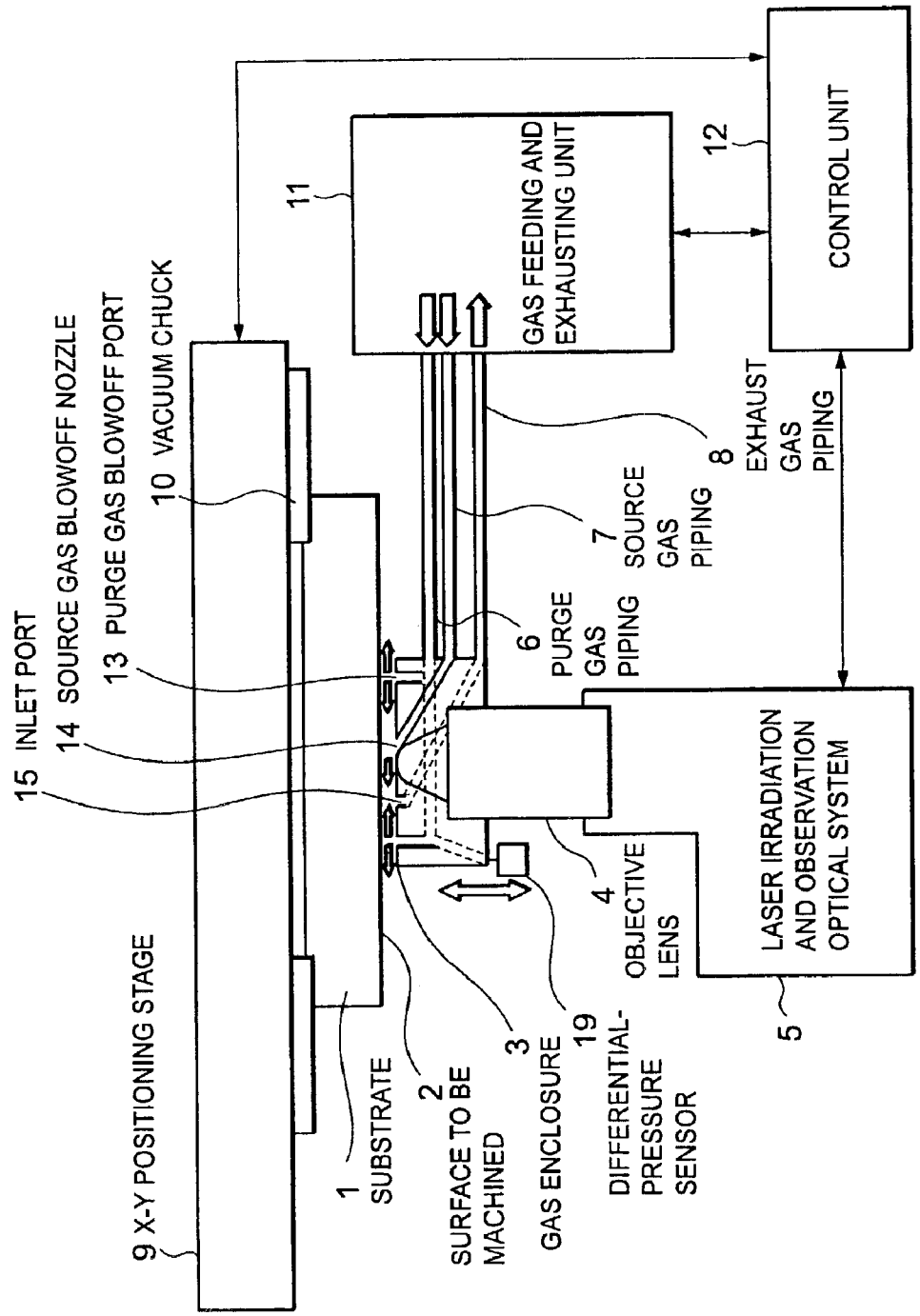
FIG. 1 is a schematic diagram for showing the configuration of a first embodiment of a laser machining apparatus in accordance with the invention.

FIG. 1 is a schematic diagram for showing the configuration of one embodiment, illustrating the configuration of an apparatus when the invention is applied to the correction of clear defects and opaque defects on semiconductor photomasks.

In this figure, a substrate 1 consisting of a photomask with the surface to be machined 2 directed downward is held by an vacuum chuck 10 provided on an X-Y positioning stage 9.

The observing of a pattern on the lower surface of the substrate 1 and the irradiating of the lower surface with a laser beam are performed using a laser irradiation and observation optical system 5 provided with an objective lens 4 at its tip, according to the movement of the X-Y positioning stage 9.

A gas enclosure 3 for introducing a laser beam and introducing and exhausting a source gas is placed between the laser irradiation and observation optical system 5 and the substrate 1. The objective lens 4 is integral with the gas enclosure 3. Also, source gas piping 7 and purge gas piping 6 for feeding the source gas and purge gas from a gas feeding and exhausting unit 11 respectively, and exhaust gas piping 8 for sucking the exhaust gas are connected to the gas enclosure 3. Further, a differential pressure sensor 19 is arranged at the base of a purge gas blowoff port 13 of the window section 3 such that it can check the gap distance between the substrate 1 and the gas enclosure 3.

A control unit 12 controls laser emission timing for the laser irradiation and observation optical system 5, switching of observation magnifications and illuminations, controlling of a focus position-adjusting mechanism, movement operation of the X-Y positioning stage 9, switching operation of source gases, and the like.

An ethyl iodide gas is employed as an etching gas with argon gas used as a carrier gas. Conventionally, in methods for gas etching of chemically inert materials such as Cr, only either the reaction of a strongly reactive halogen gas such as chlorine and fluorine with the inert materials at a high temperature or a plasma reaction has been used. At this time, the present inventor has found that ethyl iodide is particularly more advantageous as a material for laser etching than other materials in all the respects of corrosivity, toxicity and flammability, among the combined gases of halogen series and hydrocarbon series. Further, the inventor has experimentally clarified for the first time that practical etching rate can be achieved by laser etching using pulsed light irradiation.

The reaction mechanism of chromium etching can be considered as follows. An ethyl iodide gas is stable in air at room temperature, and iodine is made free by subjecting the ethyl iodide gas to light and heat. The free iodine reacts with Cr composing the pattern film to produce chromium iodide. The chromium iodide has low vapor pressure at room temperature so that it can not vaporize in a state of gas phase. However, the ethyl iodide gas adsorbing on the substrate before laser beam irradiation is thermally decomposed by instantaneous temperature rise caused by pulsed laser beam irradiation for laser etching, and at the same time, iodide reacts with Cr composing the substrate, vaporizing as a chromium iodide gas in a gas phase. When the pulsed laser beam ends, the chromium iodide in a gas phase is cooled to condense into fine particles. By adopting the placement in which the surface to be machined is directed downward, etching reaction is considered to proceed according to a unique reaction mechanism that the produced fine particles fall downward. The falling particles do not fall down toward the objective lens 4 located below, but they are forced to be taken into an inlet port 15 by a high-speed horizontal gas flow sucked into it, wherein the inlet port 15 is positioned in the blowoff direction of a source gas blowoff nozzle 14 and on the opposite side to the nozzle 14. The selected source gas, the reaction mechanism, and the recognized etching reaction as described above have not been studied for a laser machining technology, and at this time, the inventor has clarified for the first time that these can achieve a practical method and apparatus for laser machining of Cr masks.

Figure 2:
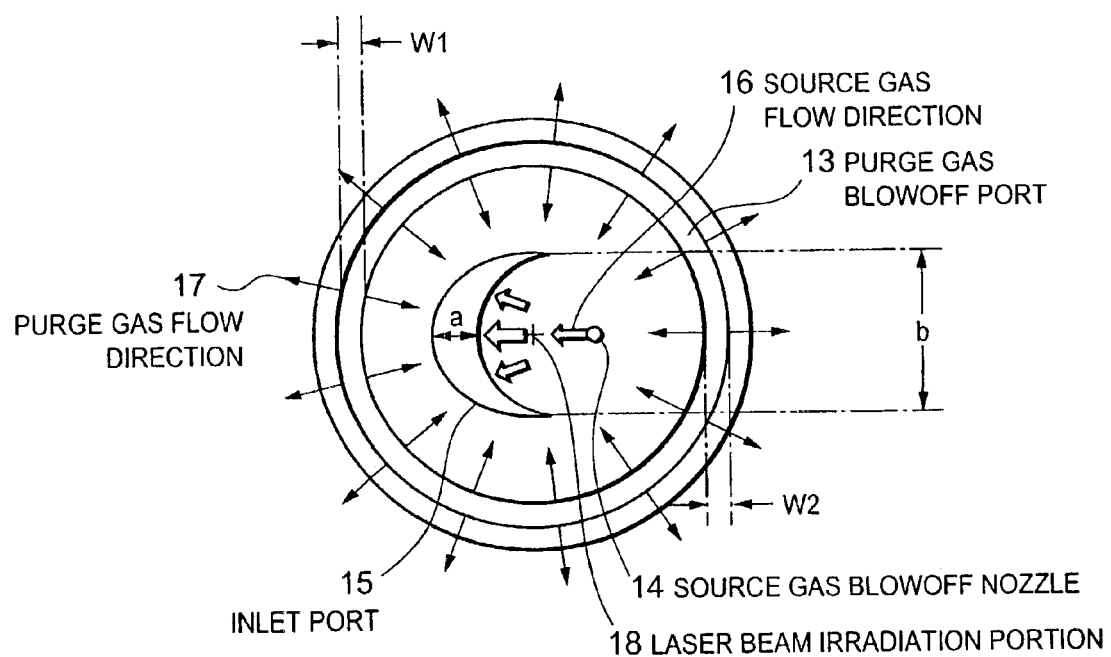
FIG. 2 is a schematic diagram for showing the configuration of a gas enclosure in accordance with the invention.

FIG. 2 is a diagram for showing the placement of the source gas blowoff nozzle and the inlet port in the gas enclosure of the invention, viewed from the substrate side opening shape.

In this figure, the source gas is provided from the source gas blowoff nozzle 14 located on the right side of a laser beam irradiation portion 18 shown by a cross hair, and the source gas is immediately sucked into the inlet port 15 consisting of an opening shaped like a crescent moon which is provided on the left side of the laser beam irradiation portion. On the other hand, the widths W1 and W2 of the purge gas blowoff port 13 are different in size, and this size difference is designed such that the amount of purge gas provided from the blowoff port portion near the inlet port 15 may be three times more than that provided from the blowoff port portion on the opposing side.

In the gap portion between the gas enclosure and the substrate, the respective ways the source gas and purge gas flow in a horizontal plane are shown as the direction of source gas flow 16 (white arrows) and the direction of purge gas flow 17 (black arrows). The placement and shapes of each opening are configured such that the source gas concentration may become higher between, the source gas blowoff nozzle 14 and the inlet port 15, and such that the concentration and velocity of flow of the source gas at the laser beam irradiation portion 18 can be optimized by adjusting the amount of blowoff from the source gas blowoff nozzle 14. On the other hand, the flow of the purge gas blowing off from the outside toward the inside can prevent the source gas from leaking to the outside of the gas enclosure 3. Because the amount of purge gas blowoff is enhanced at the blowoff port portion near the inlet port 15, the gas shield effect can not be broken even if the blowoff of source gas is enhanced to increase its velocity of flow at the laser irradiation portion. Also, the flow of purge gas to the outside of the gas enclosure prevents the air from mixing into the laser irradiation portion.

Hereinafter, the quality of correction in correcting chromium opaque defects by etching with ethyl iodide will be described in detail in comparison with the quality of correction by the conventional vaporization method.

A third harmonic light source of Nd: YAG laser (wavelength 355 nm, pulse width 20 ps, and repetition frequency 1 kHz) was used as a laser source, and etching machining was performed with the flow rate of the source gas of 10 sccm (standard cubic centimeter per minute: the flow rate in cc flowing for one minute at one atmospheric pressure), wherein the source gas is a gas containing an ethyl iodide concentration of 0.5% with argon gas used as a carrier gas, and the purge gas consisting of nitrogen gas is fed at the flow rate of 20 liter/s and sucked at the flow rate of 10 liter/s.

The objective lens used was a high-resolution ultraviolet lens having an operating range of 2 mm and NA=0.8. The purge gas blowoff port 13 has an outside diameter of 20 mm, a wider blowoff port width W1=6 mm and a narrower blowoff port width W2=2 mm, thus the width of the opening portion being provided a difference of three times between the widest portion and the narrowest portion. Also, the diameter of the source gas blowoff nozzle shown in FIG. 2 was 0.5 mm, and the size of the crescent moon like inlet port 15 was set to be the minor axis a=3 mm and the major axis b=8 mm.

For the machining characteristics, the following was obtained. By using a size of laser irradiation of 1 $\mu$m square, the etching method in accordance with the present invention was compared to the usual vaporization method, and it was observed that etching reaction in the method of the invention occurs at the laser intensity of about 30% to 80% of the machining threshold value of laser intensity in the vaporization method. When the laser intensity was a 60% intensity of the machining threshold of the vaporization method, 3 minutes was required for machining of 1 $\mu$m square, and damages in the quartz substrate under the Cr pattern were not deeper than 2 nm, the limits of sensitivity of measurement apparatus.

On the other hand, in the case of the laser vaporization machining, damage depth was as large as 10 nm even when the irradiation intensity was optimized. Further, in the laser vaporization machining, about 100 nm high bumps were observed on the Cr patterns at the edges of machined portions. However, in the case of using the etching reaction of ethyl iodide, no bump was observed. Also, no reaction product produced by laser machining adhered on the substrate around machined portions. When the flow rate of the source gas blowing off from the source gas blowoff nozzle 14 was below 5 sccm, a little amount of the reaction products was observed to be deposited on the objective lens 4, but when not less than 5 sccm, no reaction products was found to be deposited thereon.

In the above description, although the use of ethyl iodide as etching gas has been described, gases substituting bromine (Br) and chlorine (Cl) for the halogen element are also effective. Also, hydrocarbon groups are not limited to an ethyl group, but a methyl group and propane group are also effective. That is, etching gases able to be used for the present invention may be a halogenated hydrocarbon expressed in the form of CnHm-R (R is a halogen group, n is a positive integer 1, 2, or 3, m is a positive integer 3, 5, or 7).

Next, in the case in which chromium carbonyl for use in laser CVD was applied as the source gas of the invention, the gas shield effect was examined in correcting clear defects. That is, the gas shield effects were compared between a conventional type of structure having a dual concentric structure, in which an inside concentric circle configures an inlet port and an outside concentric circle configures a purge gas blowoff port, and the structure of the gas enclosure in the above embodiment of the invention. The results are shown.

When the gap distance between the gas enclosure and the substrate was 0.5 mm and the flow rate of purge gas and the flow rate of suction were 20 liter/minute and 10 liter/minute respectively, the amount of blowoff from the source gas blowoff nozzle 14 was changed from 5 to 100 sccm. In the case of the conventional type of concentric gas enclosure, when the amount of blowoff exceeded 50 sccm, leakage of the source gas around the gas enclosure and mixing of air in the laser irradiation portion were observed. In the case of the gas window structure of the invention, even when the amount of source gas blowoff was 100 sccm, neither leakage of the source gas nor mixing of air in the laser irradiation portion was observed.

Also, in the case in which the flow rate of the source gas was set to 30 sccm, by varying the gap distance between the gas enclosure 3 and the substrate 1, leakage of the source gas was compared in the above both structures. In the conventional structure, leakage was found when the gap distance was not less than 0.6 mm. In contrast, in the gas enclosure of the invention, no leakage of the source gas was found up to 1.5 mm. The ability to allow wider gaps is very effective in avoiding accidents caused by collisions between the substrate 1 and the gas enclosure 3.

By providing such a gas window and introducing the CVD source gas, effective correction of clear defects has been achieved in laser CVD as well.

Further, in the above experiments, the description has been done for the case in which the amount of gas blowoff from the purge gas blowoff port 13 is different by the amount of three times between the opening part nearest to the inlet port 15 and the opening part farthest from the inlet port. However, when differences in the amount of gas blowoff were varied in the range of 1.5 times to 3.5 times, it was possible to maintain effective gas shield effect.

Further, in the first embodiment of the invention described above, the descriptions have been done for the cases in which the reaction of laser etching and the reaction of laser CVD are performed individually. The source gas feeding unit is configured so as to feed both a source gas for CVD and a source gas for etching, whereby the methods of machining can be switched by switching between the gases according to the type of defect to be corrected. In this case, since one apparatus allows both machining processes of film-forming and film-removing, this allows the total throughput required for correction to be high speed, providing an advantage of higher practicality.

Figure 3:
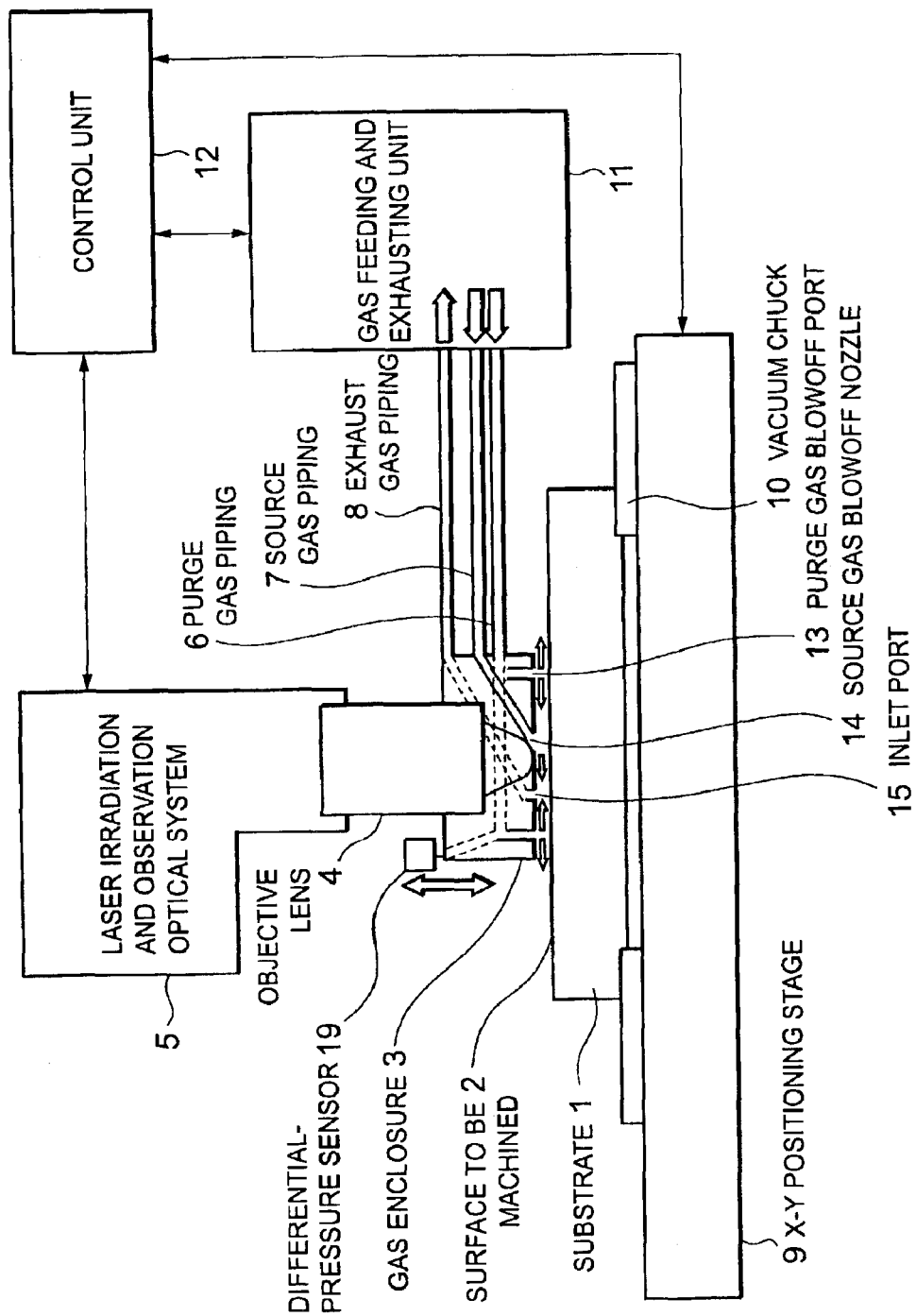
FIG. 3 is a schematic diagram for showing the configuration of a second embodiment of the invention.

Next, as a second embodiment of the invention, an apparatus performing film-forming reaction by laser CVD is shown in FIG. 3, wherein the structure of the gas enclosure shown in FIG. 2 is used and the surface to be machined of the substrate is directed upward and thus irradiated with a laser beam from above. In this case, since the substrate has the surface to be machined directed upward, there is an advantage that the substrate can be easily held on the X-Y positioning stage. Further, even if the velocity of flow of source gas is made higher at the laser irradiation portion as compared to the conventional gas enclosure provided with dual concentric openings for suction and blowoff, of purge gas, the leakage of the source gas into the surroundings does not occur. Therefore, higher velocity of flow of the source gas can suppress the adherence of fine particles depositing on the surrounding area of the CVD film, improving the quality of correction.

Further, in this structure, by introducing laser etching using an etching gas including a halogenated hydrocarbon described in the first embodiment, it is also possible to make up an apparatus having both functions of film deposition and film-removing.

Further, needless to say, it is possible to make up a laser machining apparatus having an additional machining process of film-removing using the conventionally known reaction of laser vaporization.

While the present invention has been described in connection with certain preferred embodiments, it is to be understood that the subject matter encompassed by the present invention is not limited to those specific embodiments. On the contrary, it is intended to include all alternatives, modifications, and equivalents as can be included within the spirit and scope of the following claims.

What is claimed is:

1. A laser machining apparatus for removing a desired portion on a substrate by irradiating said substrate with a laser beam in an atmosphere of a source gas, comprising:

a laser irradiation and observation system for performing optical observation on a portion to be machined on said substrate held on a X-Y positioning stage and irradiation with said laser beam, a gas enclosure for forming a local atmosphere of an etching source gas or a local atmosphere of a CVD source gas around said portion to be machined with a small gap formed between a surface to be machined and said gas enclosure without contact with said surface to be machined on said substrate, and a source gas feeding and exhausting unit for feeding said source gas into said gas enclosure and exhausting it from said gas enclosure, wherein:

said substrate has said surface to be machined directed downward, said laser irradiation and observation optical system is arranged to perform said optical observation and said irradiation with said laser beam on a desired portion on said substrate from below, and said gas enclosure comprises a nozzle for blowing said source gas on a laser beam irradiation position of the portion to be machined on said substrate; a inlet port shaped like a crescent moon having the center of its opening positioned symmetrically with said nozzle with respect to said laser irradiation portion which is positioned in between said nozzle and said center in a horizontal plane; and a purge gas blowoff port shaped like a donut having opening widths varied such that the amount of purge gas blowing off from the opening portion near said inlet port is more than the amount of purge gas blowing off from the opening portion near said nozzle.

2. The laser machining apparatus according to claim 1, wherein said etching gas is a source gas containing a halogenated hydrocarbon formed by the combination of any one halogen group of iodine, chlorine and bromine and any one hydrocarbon group of methyl group, ethyl group, and propane group.

3. The laser machining apparatus according to claim 1, wherein said substrate is a chromium mask substrate.

4. The laser machining apparatus according to claim 1, wherein said source gas feeding and exhausting unit comprises a mechanism for switching between said etching source gas and said CVD source gas according to a type of defect to be corrected.

5. The laser machining apparatus according to claim 1, where the amount of purge gas blowing off from the portion of the purge gas blowoff port near the inlet port is 1.5 times to 3.5 times more than the amount of the purge gas blowing off from the portion of the purge gas blowoff port near said nozzle.

6. A laser machining apparatus for removing a desired portion on a substrate by irradiating said substrate with a laser beam in an atmosphere of a source gas, comprising:
   a laser irradiation and observation system for performing irradiation with a said laser beam and optical observation on a portion to be machined on said substrate held on a X-Y positioning stage,
   a gas endosure for forming a local atmosphere of an etching source gas or a local atmosphere of a CVD source gas around said portion to be machined with a small gap formed between a surface to be machined and said gas enclosure without contact with said surface to be machined on said substrate, and
   a source gas feeding and exhausting unit for feeding said source gas into said gas endosure and exhausting it from said gas enclosure, wherein:
   said substrate has said surface to be machined directed upward,
   said laser irradiation and observation optical system is arranged to perform said optical observation and said irradiation with said laser beam on a desired portion on said substrate from above, and
   said gas enclosure comprises a nozzle for blowing said source gas to a laser beam irradiation position of the portion to be machined on said substrate; a inlet port shaped like a crescent moon having the center of its opening positioned symmetrically with said nozzle with respect to said laser irradiation portion which is positioned in between said nozzle and said center in a horizontal plane; and a purge gas blowoff port shaped like a donut having opening widths varied such that the amount of purge gas blowing off from the opening portion near said inlet port is more than the amount of purge gas blowing off from the opening portion near said nozzle.

7. The laser machining apparatus according to claim 6, wherein said etching gas is a source gas containing a halogenated hydrocarbon formed by the combination of any one halogen group of iodine, chlorine and bromine and any one hydrocarbon group of methyl group, ethyl group, and propane group.

8. The laser machining apparatus according to claim 6, wherein said substrate is a chromium mask substrate.

9. The laser machining apparatus according to claim 6, wherein said source gas feeding and exhausting unit comprises a mechanism for switching between said etching source gas and said CVD source gas according to a type of defect to be corrected.

10. The laser machining apparatus according to claim 6, where the amount of purge gas blowing off from the portion of the purge gas blowoff port near the inlet port is 1.5 times to 3.5 times more than the amount of the purge gas blowing off from the portion of the purge gas blowoff port near said nozzle.

11. A laser machining apparatus for removing a desired portion on a substrate by irradiating said substrate with a laser beam in an atmosphere of a source gas, comprising:
   a laser irradiation and observation system for performing optical observation on a portion to be machined on said substrate held on a X-Y positioning stage and irradiation with said laser beam,
   a gas enclosure for forming a local atmosphere of an etching source gas or a local atmosphere of a CVD source gas around said portion to be machined with a small gap formed between a surface to be machined and said gas enclosure without contact with said surface to be machined on said substrate, and
   a source gas feeding and exhausting unit for feeding said source gas into said gas enclosure and exhausting it from said gas enclosure, wherein:
   said substrate has said surface to be machined directed downward,
   said laser irradiation and observation optical system is arranged to perform said optical observation and said irradiation with said laser beam on a desired portion on said substrate from below, and
   said gas enclosure comprises a nozzle for blowing said source gas on a laser beam irradiation position of the portion to be machined on said substrate; a inlet port shaped like a crescent moon having the center of its opening positioned symmetrically with said nozzle with respect to said laser irradiation portion which is positioned in between said nozzle and said center in a horizontal plane; and a purge gas blowoff port shaped like a donut having varied opening widths.

12. A laser machining apparatus for removing a desired portion on a substrate by irradiating said substrate with a laser beam in an atmosphere of a source gas, comprising:
   a laser irradiation and observation system for performing irradiation with said laser beam and optical observation on a portion to be machined on said substrate held on a X-Y positioning stage,
   a gas enclosure for forming a local atmosphere of an etching source gas or a local atmosphere of a CVD source gas around said portion to be machined with a small gap formed between a surface to be machined and said gas enclosure without contact with said surface to be machined on said substrate, and
   a source gas feeding and exhausting unit for feeding said source gas into said gas enclosure and exhausting it from said gas enclosure, wherein:
   said substrate has said surface to be machined directed upward,
   said laser irradiation and observation optical system is arranged to perform said optical observation and said irradiation with said laser beam on a desired portion on said substrate from above, and
   said gas enclosure comprises a nozzle for blowing said source gas to a laser beam irradiation position of the portion to be machined on said substrate; a inlet port shaped like a crescent moon having the center of its opening positioned symmetrically with said nozzle with respect to said laser irradiation portion which is positioned in between said nozzle and said center in a horizontal plane; and a purge gas blowoff port shaped like a donut having varied opening widths.

* * * * *